United States Patent
Choi et al.

(10) Patent No.: US 7,517,750 B2
(45) Date of Patent: Apr. 14, 2009

(54) FLASH MEMORY DEVICES HAVING MULTILAYERED INTER-GATE DIELECTRIC LAYERS INCLUDING METAL OXIDE LAYERS AND METHODS OF MANUFACTURING THE SAME

(75) Inventors: Han-Mei Choi, Seoul (KR); Young-Geun Park, Suwon-si (KR); Seung-Hwan Lee, Suwon-si (KR); Young-Sun Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 98 days.

(21) Appl. No.: 11/383,102

(22) Filed: May 12, 2006

(65) Prior Publication Data

US 2007/0026608 A1 Feb. 1, 2007

(30) Foreign Application Priority Data

Jul. 29, 2005 (KR) .................... 10-2005-0069863

(51) Int. Cl.
*H01L 21/8238* (2006.01)
(52) U.S. Cl. .................. 438/211; 438/257; 438/261; 438/593; 257/E21.179; 257/E21.422
(58) Field of Classification Search ............... 438/176; 257/E21.177, E21.179, E21.421, E21.681
See application file for complete search history.

(56) References Cited

U.S. PATENT DOCUMENTS

| 6,627,503 | B2 | 9/2003 | Ma et al. |
|---|---|---|---|
| 6,645,882 | B1 | 11/2003 | Halliyal et al. |
| 6,660,660 | B2 | 12/2003 | Haukka et al. |
| 2002/0115252 | A1* | 8/2002 | Haukka et al. ............ 438/240 |
| 2004/0051134 | A1* | 3/2004 | Jang et al. ............ 257/316 |
| 2006/0043463 | A1* | 3/2006 | Liu et al. ............ 257/316 |
| 2007/0059945 | A1* | 3/2007 | Mohklesi ............ 438/778 |

FOREIGN PATENT DOCUMENTS

KR   10-2004-0106074 A   12/2004

* cited by examiner

*Primary Examiner*—Walter L Lindsay, Jr.
*Assistant Examiner*—Cheung Lee
(74) *Attorney, Agent, or Firm*—Myers Bigel Sibley & Sajovec, PA

(57) ABSTRACT

Embodiments of the present invention provide methods of manufacturing memory devices including forming floating gate patterns on a semiconductor substrate having active regions thereon, wherein the floating gate patterns cover the active regions and are spaced apart from the active regions; forming an inter-gate dielectric layer on the semiconductor substrate having the floating gate patterns by alternately stacking a zirconium oxide layer and an aluminum oxide layer at least once, wherein the inter-gate dielectric layer is formed by a deposition process using $O_3$ gas as a reactive gas; forming a control gate layer on the inter-gate dielectric layer; and forming a control gate, an inter-gate dielectric layer pattern and a floating gate by sequentially patterning the control gate layer, the inter-gate dielectric layer and the floating gate pattern, wherein the inter-gate dielectric layer pattern and the control gate are sequentially stacked across the active regions, and the floating gate is formed between the active regions and the inter-gate dielectric layer pattern Memory devices, such as flash memory devices are also provided.

29 Claims, 8 Drawing Sheets

FLASH MEMORY DEVICES HAVING MULTILAYERED INTER-GATE DIELECTRIC LAYERS INCLUDING METAL OXIDE LAYERS AND METHODS OF MANUFACTURING THE SAME

CROSS-REFERENCE TO RELATED APPLICATION

This application claims priority to Korean Patent Application No. 10-2005-0069863, filed Jul. 29, 2005, the disclosure of which is incorporated herein by reference in its entirety as if set forth fully herein.

FIELD OF THE INVENTION

The present invention relates to semiconductor devices and methods of manufacturing the same, and more particularly, to memory devices including multilayered inter-gate dielectric layers and methods of manufacturing the same.

BACKGROUND OF THE INVENTION

A flash memory device includes a memory device that may retain written data despite an abrupt power interruption. A metal oxide semiconductor (MOS) transistor of a flash memory device may include a floating gate, which can accumulate an electric charge. In the flash memory device, a thin gate oxide layer, such as a tunnel insulating layer, can be disposed on a semiconductor substrate. The floating gate, which can be formed of a conductive material, can be disposed on the gate oxide layer. A control gate can be disposed over the floating gate by interposing an inter-gate dielectric layer between the control gate and the floating gate. Accordingly, the floating gate can be electrically insulated from the semiconductor substrate and the control gate by the tunnel insulating layer and the inter-gate dielectric layer. The inter-gate dielectric layer may include an oxide-nitride-oxide (ONO) structure, for example, a SiO2/Si3N4/SiO2 structure.

However, since the inter-gate dielectric layer including the ONO structure may have a low dielectric constant, there may be a limitation in lowering the equivalent oxide thickness (EOT). In order to address the low dielectric constant of the ONO dielectric layer, a metal oxide layer having a dielectric constant of 8 or higher may be used as the inter-gate dielectric layer. The dielectric constants and energy bandgaps of $SiO_2$, $Si_3N_4$, and other metal oxides are shown below in Table 1.

TABLE 1

| Inter-gate Dielectric Layer | Dielectric Constant | Energy bandgap(eV) |
|---|---|---|
| $SiO_2$ | 3.9 | 8.9 |
| $Si_3N_4$ | 7 | 5.1 |
| $Al_2O_3$ | 9 | 8.7 |
| $ZrO_2$ | 35~40 | 5.5~5.8 |

As can be seen from Table 1, $SiO_2$, which can be applied to the ONO dielectric layer, may have a dielectric constant of 3.9 and an energy bandgap of 8.9 eV, and $Si_3N_4$, which can also be applied to the ONO dielectric layer, may have a dielectric constant of 7 and an energy bandgap of 5.1 eV. Because the ONO dielectric layer may have a relatively low dielectric constant, it may not meet the conditions of high integration density. In other words, it may be problematic to reduce the thickness of the ONO inter-gate dielectric layer due, at least in part, to its low dielectric constant so that the inter-gate dielectric layer may not be readily applied to a high-speed/high-integrated device.

An aluminum oxide ($Al_2O_3$) layer may have a suitable energy bandgap of 8.7 eV, but its dielectric constant of around 8 may be too low to affect the EOT. A zirconium oxide ($ZrO_2$) layer may exhibit a higher dielectric constant of 35 to 40, which may be sufficient to lower the EOT, but may have a lower bandgap of 5.5 to 5.8 eV, and thus, leakage current characteristics may decline. Therefore, a dielectric layer including a combination of zirconium oxide and aluminum oxide may be formed in order to address some of the disadvantages associated with using either oxide alone.

A method of forming a dielectric layer by stacking the zirconium oxide layer and the aluminum oxide layer is discussed in U.S. Pat. No. 6,660,660 entitled "Methods for Making a Dielectric Stack in an Integrated Circuit." According to U.S. Pat. No. 6,660,660, a zirconium oxide layer and an aluminum oxide layer are formed by an atomic layer deposition (ALD) process. The zirconium oxide layer is formed using $ZrCl_4$ and $H_2O$ as a source gas and a reactive gas, respectively, and the aluminum oxide layer is formed using TMA(trimethyl aluminum; $Al(CH_3)_3$) and $H_2O$ as a source gas and a reactive gas, respectively. However, when the zirconium oxide layer and the aluminum oxide layer are formed using $H_2O$ as a reactive gas, they may contain —OH radicals. As a result, the dielectric layer may be degraded due to the chemical properties of —OH radicals.

Furthermore, when two or more material layers are formed by the ALD process, the $ZrCl_4$ and TMA source gases may be transferred and sprayed through respective gas supply lines configured to provide the source gas to a shower head mounted in a chamber. In this case, it may be cost-effective for the source gases to be transferred and sprayed at similar temperatures. However, the $ZrCl_4$ source gas is usually transferred at a temperature of about 180 to 200° C., while the TMA source gas is usually transferred at a temperature of about 20 to 130° C. For example, if the TMA source gas is transferred through a gas supply line that is configured to contain a gas and maintain the temperature of the gas within the gas supply line at a temperature of higher than about 130° C., the TMA source gas may decompose in the gas supply line before it is sprayed into the chamber. Thus, the TMA source may not retain its chemical properties. To reduce the occurrence of this phenomenon, the temperatures within the gas supply lines may be separately controlled in one shower head. However, it may be difficult to separately control the temperatures of the gas lines, and such issues related to temperature control may result in decreased efficiency of the manufacturing process.

SUMMARY OF THE INVENTION

Embodiments of the present invention provide a memory device having an inter-gate dielectric layer with a higher dielectric constant, a reduced equivalent oxide thickness (EOT) and/or improved leakage current characteristics, and methods of manufacturing the same.

According to some embodiments, the present invention provides methods of manufacturing a memory device, such as a flash memory device, having a multilayered inter-gate dielectric layer. Methods of manufacturing a memory device according to some embodiments of the present invention include forming floating gate patterns on a semiconductor substrate having active regions thereon, wherein the floating gate patterns cover the active regions and are spaced apart from the active regions; forming an inter-gate dielectric layer on the semiconductor substrate having the floating gate patterns by alternately stacking oxide layers, for example, a zirconium oxide layer and an aluminum oxide layer, at least once, wherein the inter-gate dielectric layer is formed by a process using ozone ($O_3$) gas as a reactive gas; forming a control gate layer on the inter-gate dielectric layer; and forming a control gate, an inter-gate dielectric layer pattern and a floating gate by sequentially patterning the control gate layer, the inter-gate dielectric layer and the floating gate pattern, wherein the inter-gate dielectric layer pattern and the control gate are sequentially stacked across the active regions, and the floating gate is formed between the active regions and the inter-gate dielectric layer pattern.

Further, the methods may include preparing a semiconductor substrate having active regions. Floating gate patterns may be formed on the semiconductor substrate such that they cover the active regions and are spaced apart from the active regions. A zirconium oxide layer and an aluminum oxide layer may be alternately stacked at least twice, thereby forming an inter-gate dielectric layer on the semiconductor substrate having the floating gate patterns. The inter-gate dielectric layer may be formed by an atomic layer deposition (ALD) process using $O_3$ gas as a reactive gas. A control gate layer may be formed on the inter-gate dielectric layer. The control gate layer, the inter-gate dielectric layer, and the floating gate patterns may be sequentially patterned, thereby forming control gates, inter-gate dielectric layer patterns and floating gates. The inter-gate dielectric layer patterns and the control gates may be sequentially stacked across the active regions, and the floating gates may be formed between the active regions and the inter-gate dielectric layer patterns.

In some embodiments, the present invention provides methods of fabricating a flash memory device. The methods of manufacturing a flash memory device include preparing a semiconductor substrate having active regions thereon; and forming a floating gate, an inter-gate dielectric layer pattern, and a control gate which are sequentially stacked across the active regions and spaced apart from the active regions on the semiconductor substrate, wherein the inter-gate dielectric layer pattern is formed by alternately stacking a zirconium oxide layer and an aluminum oxide layer at least twice employing an atomic layer deposition (ALD) process using $O_3$ gas as a reactive gas. Further, the methods may include preparing a semiconductor substrate having active regions. A floating gate, an inter-gate dielectric layer pattern, and a control gate may be sequentially stacked on the semiconductor substrate. The floating gate, the inter-gate dielectric layer pattern, and the control gate may be formed across the active regions and spaced apart from the active regions. The inter-gate dielectric layer pattern may be formed by alternately stacking a zirconium oxide layer and an aluminum oxide layer at least twice through an ALD process using $O_3$ gas as a reactive gas.

In further embodiments, the present invention provides a memory device including a semiconductor substrate having active regions; and a floating gate, an inter-gate dielectric layer pattern, and a control gate which are sequentially stacked across the active regions and spaced apart from the active regions on the semiconductor substrate, wherein the inter-gate dielectric layer pattern comprises a zirconium oxide layer and an aluminum oxide layer that are alternately stacked at least twice. Further, the memory device may include a flash memory device having a multilayered inter-gate dielectric layer. The flash memory device may include a semiconductor substrate having active regions. A floating gate, an inter-gate dielectric layer pattern, and a control gate may be sequentially stacked on the semiconductor substrate to cross the active regions and be spaced apart from the active regions. The inter-gate dielectric layer pattern may include a zirconium oxide layer and an aluminum oxide layer that are alternately stacked at least twice.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
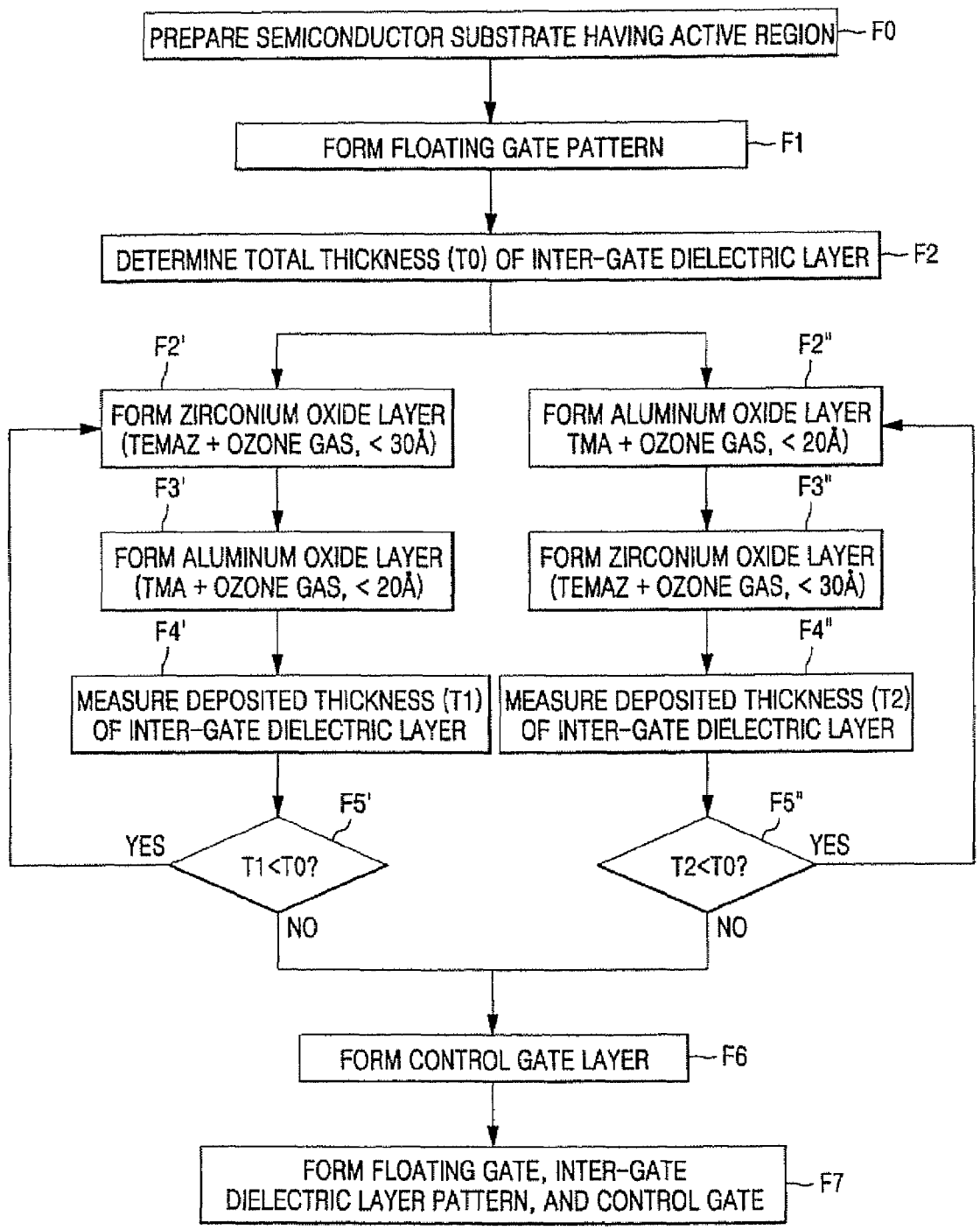
FIG. 1 presents a process flowchart illustrating a method of fabricating a NOR-type flash memory device according to some embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. All publications, patent applications, patents, and other references mentioned herein are incorporated by reference in their entirety.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Moreover, it will be understood that steps comprising the methods provided herein can be performed independently or at least two steps can be combined. Additionally, steps comprising the methods provided herein, when performed independently or combined, can be performed at the same temperature and/or atmospheric pressure or at different temperatures and/or atmospheric pressures without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Various embodiments of the present invention will now be described with reference to FIGS. 1-8B.

Figure 2:
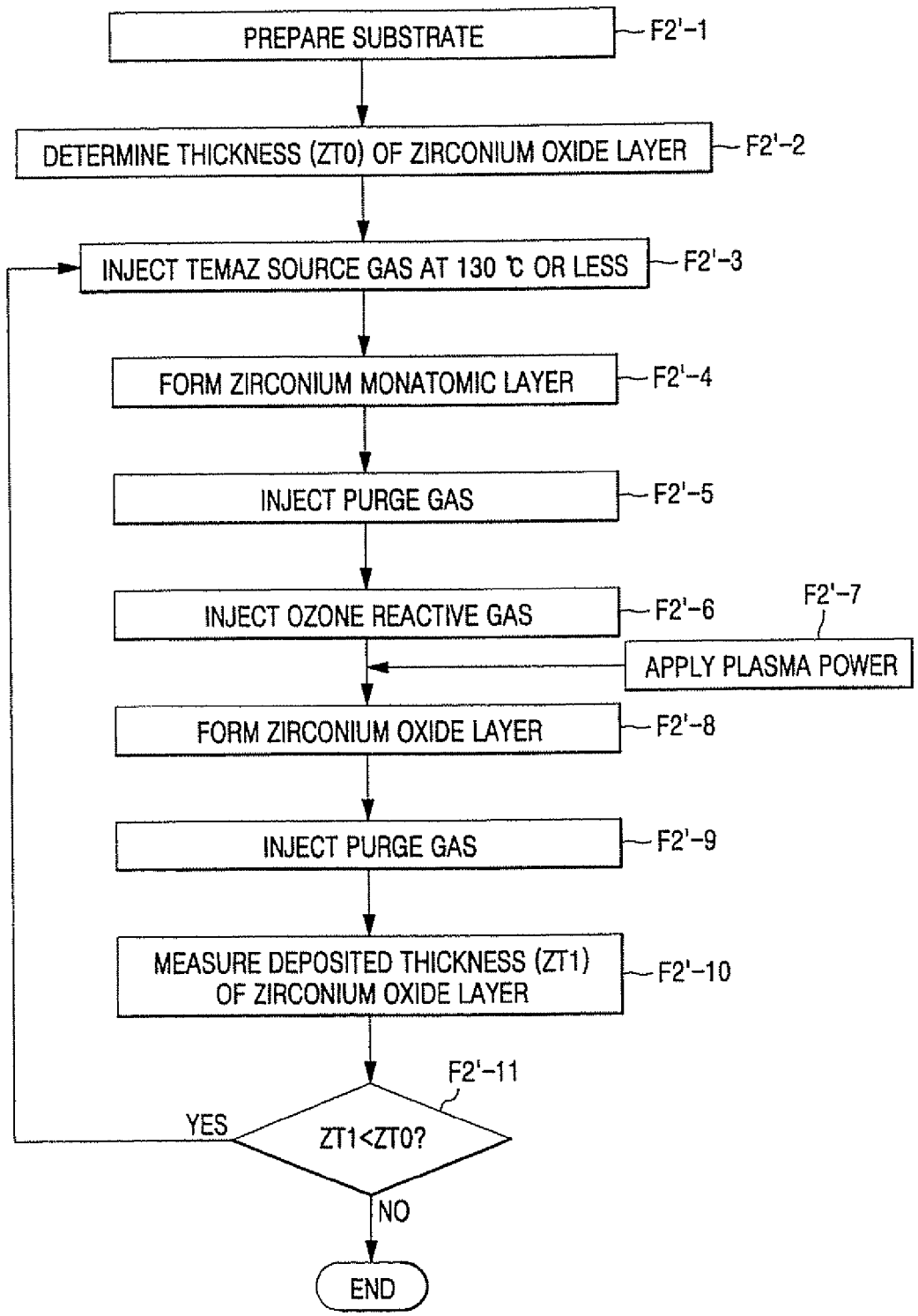
FIG. 2 presents a process flowchart illustrating a method of forming a zirconium oxide layer according to some embodiments of the present invention as shown in FIG. 1.
Figure 3:
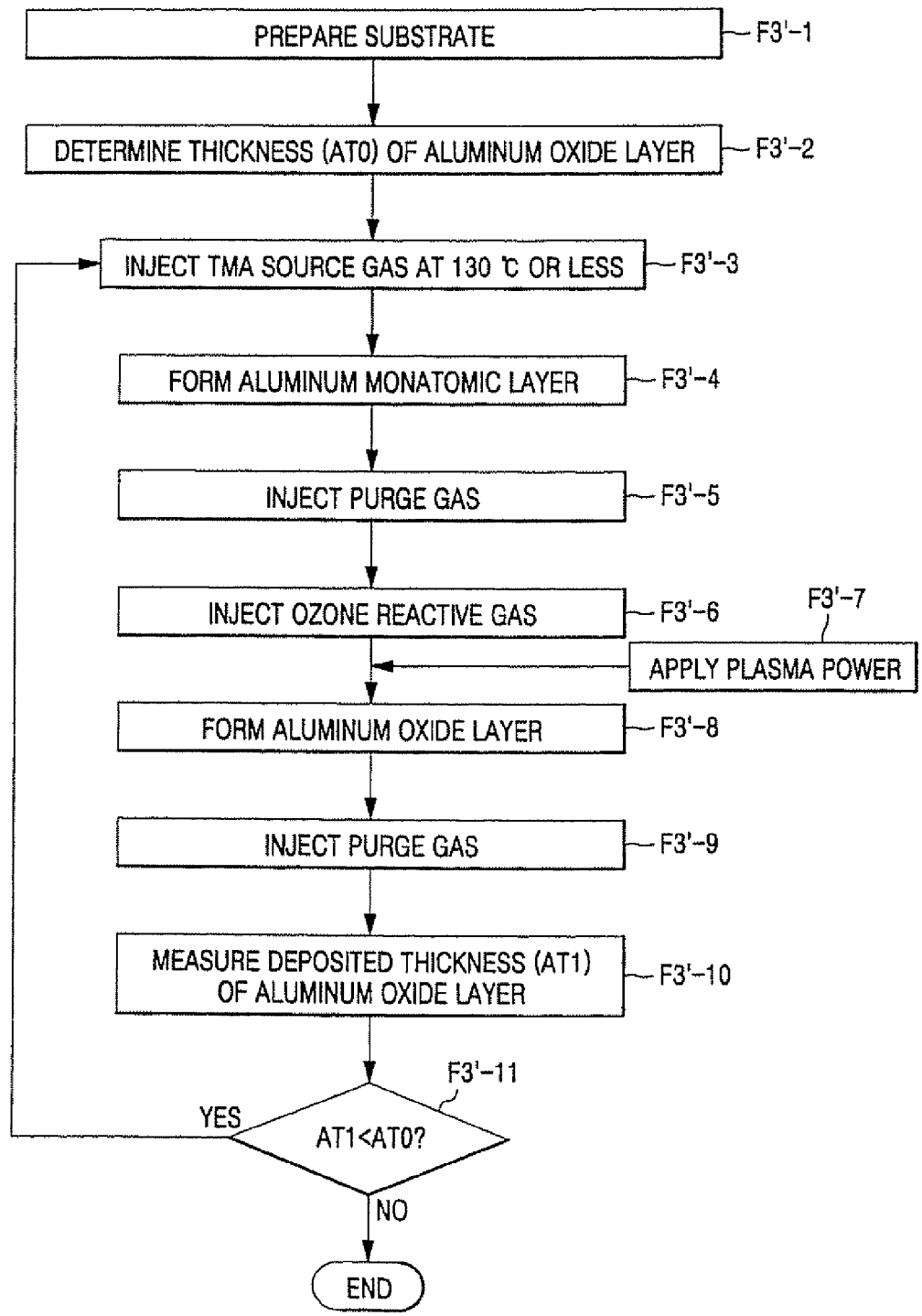
FIG. 3 presents a process flowchart illustrating a method of forming an aluminum oxide layer according to some embodiments of the present invention as shown in FIG. 1.

FIG. 1 presents a process flowchart illustrating a method of fabricating a NOR-type flash memory device according to some embodiments of the present invention, FIG. 2 presents a process flowchart illustrating a method of forming a zirconium oxide layer according to some embodiments of the present invention as shown in FIG. 1, and FIG. 3 presents a process flowchart illustrating a method of forming an aluminum oxide layer according to some embodiments of the present invention as shown in FIG. 1.

Figure 4:
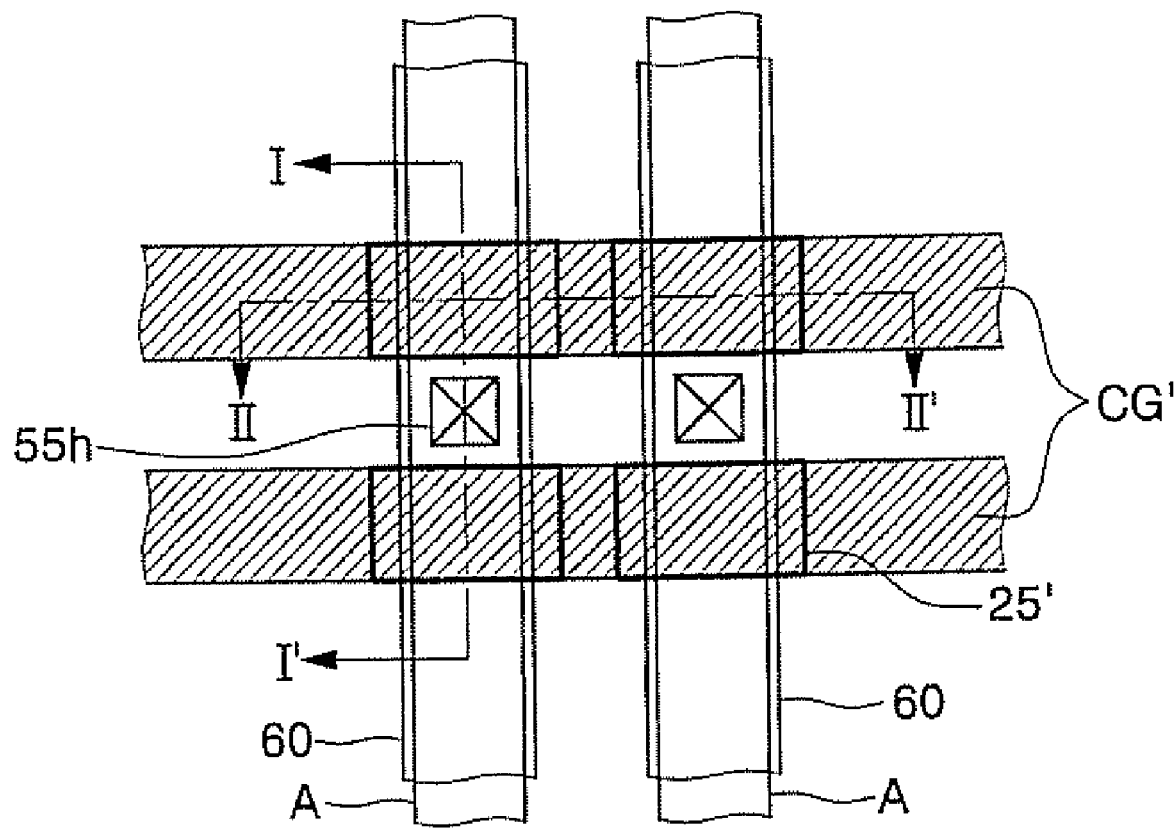
FIG. 4 presents a schematic illustrating a NOR-type flash memory device according to some embodiments of the present invention.
Figure 5A:
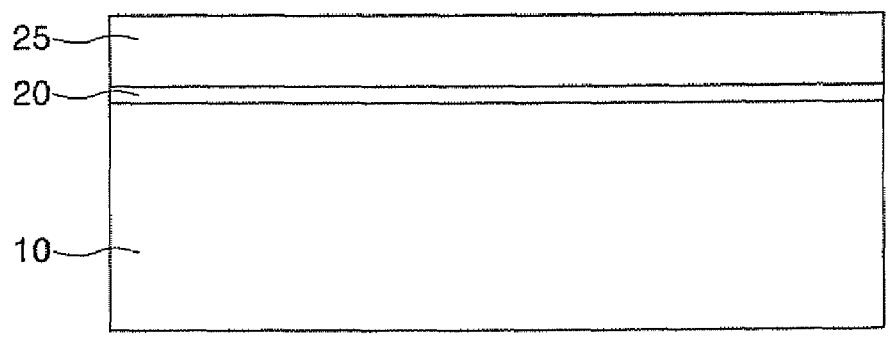
FIGS. 5A, 6A, 7A and 8A present cross-sectional views taken along line I-I' of FIG. 4, presenting schematics illustrating a method of manufacturing a NOR-type flash memory device according to some embodiments of the present invention.
Figure 5B:
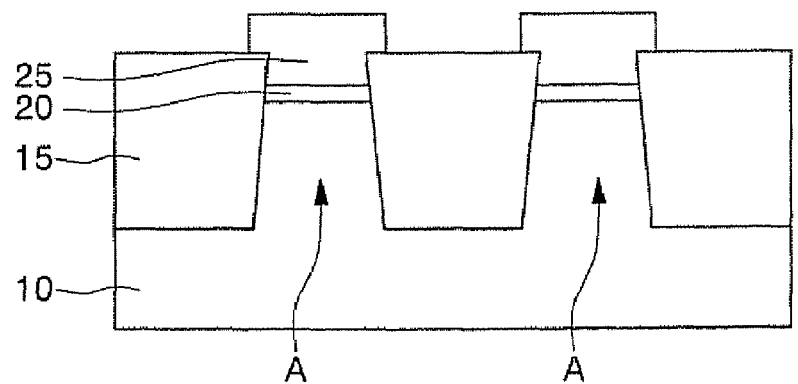
FIGS. 5B, 6B, 7B and 8B present cross-sectional views taken along line II-II' of FIG. 4, presenting schematics illustrating a method of manufacturing a NOR-type flash memory device according to some embodiments of the present invention.
Figure 6A:
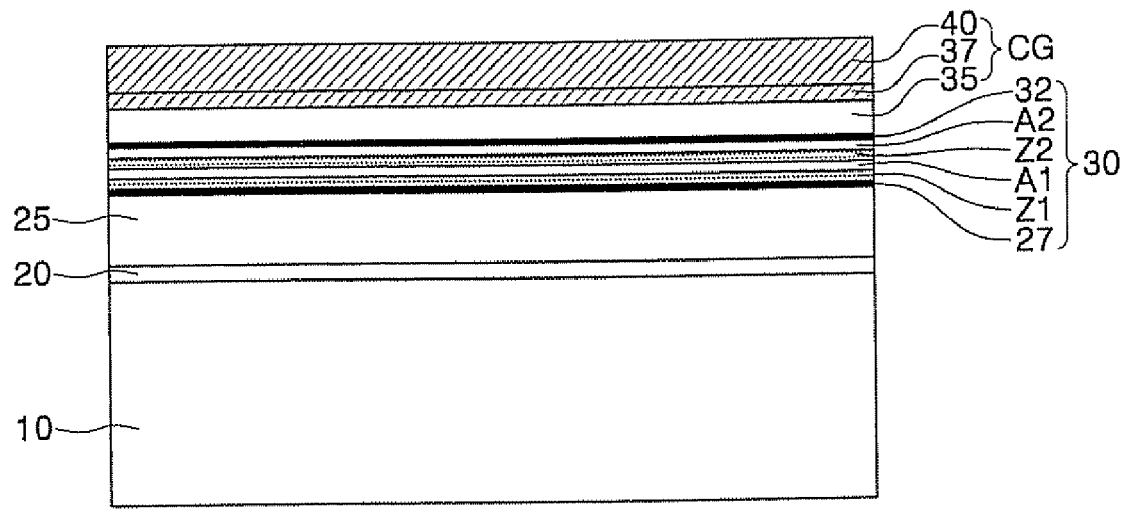
Figure 6B:
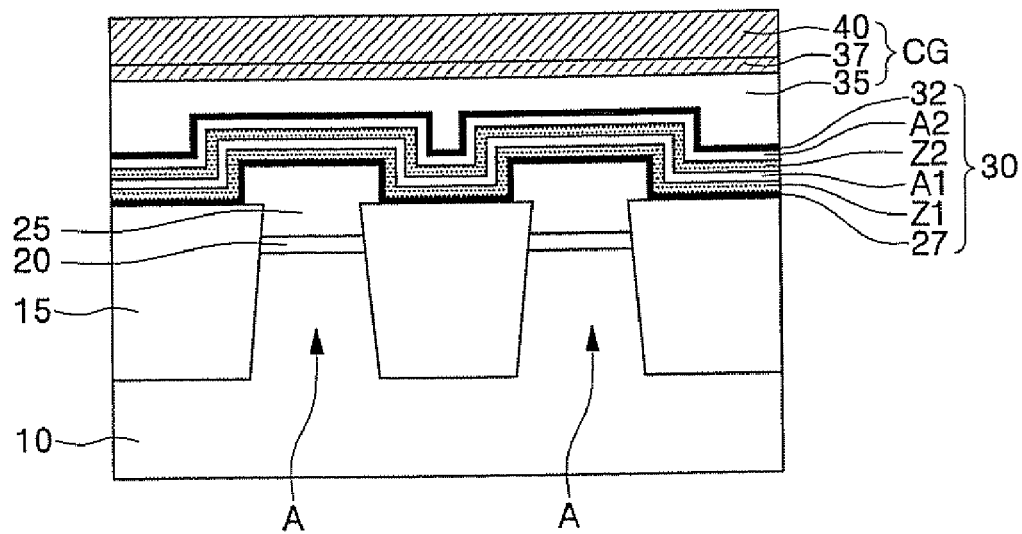
Figure 7A:
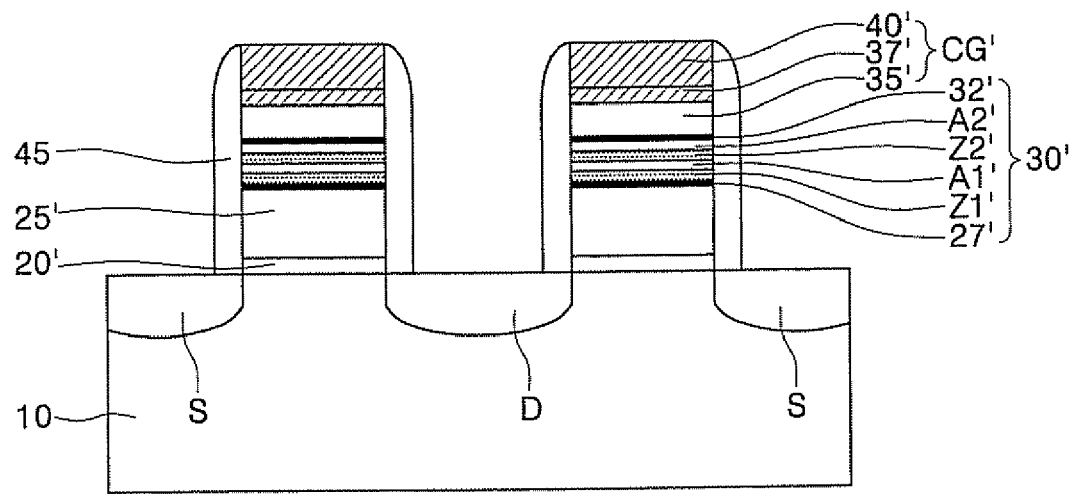
Figure 7B:
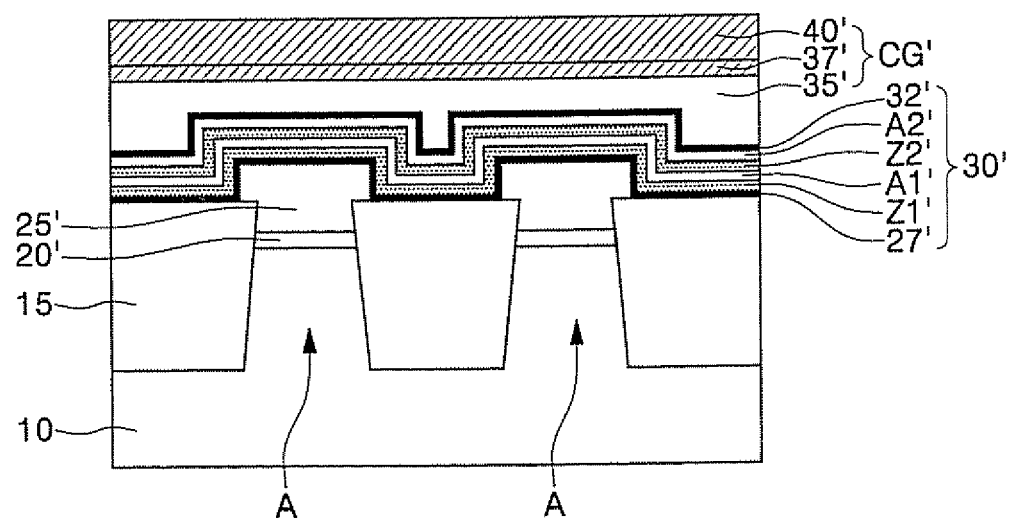

FIG. 4 illustrates the layout of a NOR-type flash memory device according to some embodiments of the present invention, FIGS. 5A, 6A, 7A and 8A present cross-sectional views taken along line I-I' of FIG. 4, illustrating a method of fabricating a NOR-type flash memory device, and FIGS. 5B, 6B, 7B and 8B present cross-sectional views taken along line II-II' of FIG. 4, illustrating a method of fabricating the NOR-type flash memory device.

Referring to FIGS. 1, 4, 5A, and 5B, an ion implantation process may be performed on a semiconductor substrate 10, thereby forming a well region.

An isolation layer 15 is formed in the semiconductor substrate 10 having the well region to define a plurality of active regions A (step F0 of FIG. 1). A tunnel oxide layer 20 is formed on the semiconductor substrate 10 having the active regions A. The tunnel oxide layer 20 may be formed by a thermal oxidation process.

Thereafter, floating gate patterns 25 may be formed on the semiconductor substrate 10 having the tunnel oxide layer 20 to cover the active regions A (step F1 of FIG. 1). The floating gate patterns 25 may be formed of a polysilicon layer. In some embodiments, the floating gate patterns 25 may be formed by sequentially stacking a polysilicon layer and a metal nitride layer. Alternatively, the floating gate patterns 25 may be formed of a metal nitride layer. The metal nitride layer may be formed of at least one nitride layer including a tungsten nitride (WN) layer, a titanium nitride (TiN) layer, and a tantalum nitride (TaN) layer. The metal nitride layer may be formed using at least one deposition process including an atomic layer deposition (ALD) process, a sequential flow deposition (SFD) process, a chemical vapor deposition (CVD) process, and a physical vapor deposition (PVD) process.

Referring to FIGS. 1, 2, 3, 4, 6A, and 6B, an inter-gate dielectric layer 30 is formed on the floating gate patterns 25. The inter-gate dielectric layer 30 is formed by alternately stacking a zirconium oxide (ZrO) layer and an aluminum oxide (AlO) layer at least twice using an ALD process. A silicon oxide (SiO) layer or AlO layer with a high energy band gap may be formed on the lowermost portion and/or uppermost portion of the inter-gate dielectric layer 30 to raise an energy barrier against leakage current. The SiO layer or AlO layer may be formed to a thickness of 10 Å or less. The total thickness of the inter-gate dielectric layer 30 may be formed to a thickness in a range of about 100 to 500 Å (step F2 of FIG. 1).

The zirconium oxide layer may be formed by an ALD process using a TEMAZ(tetrakis methylethylamino zirconium; $Zr[N(CH_3)(C_2H_5)]_4$) source gas and an ozone ($O_3$) reactive gas (step F2' of FIG. 1). More specifically, a SiO layer or AlO layer may be formed on the semiconductor substrate 10 having the floating gate patterns 25. In some embodiments, a lower SiO layer 27 is formed. A first zirconium oxide layer Z1 may be formed on the semiconductor substrate 10 having the lower SiO layer 27.

A method of forming a first zirconium oxide layer Z1 will now be described in detail with reference to FIG. 2. The semiconductor substrate 10 having the lower SiO layer 27 is loaded into a chamber of an ALD apparatus (step F2'-1 of FIG. 2). The inside of the chamber may be maintained at a temperature in a range of about 200 to 320° C. under a pressure in a range of about 0.1 to 3 Torr. A thickness ZT0 of the zirconium oxide layer is determined (step F2'-2 of FIG. 1). When the zirconium oxide layer is formed to a thickness of about 30 Å or more, it may be crystallized. Accordingly, the thickness ZT0 of the zirconium oxide layer may be below about 30 Å. A TEMAZ source gas is supplied, for example injected, into the chamber (step F2'-3 of FIG. 1). The TEMAZ source gas may be supplied into the chamber while a gas supply line disposed in a shower head mounted in the chamber is configured to maintain the gas in the gas supply line at a temperature in a range of about 80 to 130° C. for a sufficient period of time. The TEMAZ source gas may be supplied for a period of time in a range of about 0.5 to 3 seconds. During this process, by supplying the TEMAZ source gas into the chamber, a zirconium monatomic layer is chemisorbed on the semiconductor substrate 10 having the lower SiO layer 27 (step F2'-4 of FIG. 2).

Thereafter, a purge gas is supplied into the chamber (step F2'-5 of FIG. 2). An inert gas, for example, argon gas or nitrogen gas, may be employed as the purge gas. The purge gas may be supplied for a period of time in a range of about 0.5 to 20 seconds. By supplying the purge gas into the chamber as described above, portions of the TEMAZ source gas, which are floating or physisorbed in the chamber, may be removed. In other embodiments, the inside of the chamber may be maintained in vacuum for a period of time in a range of about 2 to 10 seconds instead of supplying the purge gas to the chamber. Accordingly, portions of the TEMAZ source gas, which are floating or physisorbed in the chamber, may be removed. In still other embodiments, the purge gas may be supplied into the chamber while the inside of the chamber is continuously evacuated in order to obtain the same or similar effect.

Subsequently, an ozone reactive gas is supplied, for example injected, into the chamber (step F2'-6 of FIG. 2). The ozone reactive gas may be supplied for a period of time in a range of about 1 to 7 seconds. The ozone reactive gas reacts with the chemisorbed zirconium monatomic layer, thus generating the zirconium oxide layer (step F2'-8 of FIG. 2). In some embodiments, plasma power may be supplied to the chamber in which the ozone reactive gas is supplied (step F2'-7 of FIG. 2). As a result, plasma may be generated in the chamber during the formation of the zirconium oxide layer, which may impart properties to zirconium oxide layer. By using the ozone reactive gas in forming the zirconium oxide layer, the degradation of a dielectric layer due to —OH radicals contained in the dielectric layer may be reduced or prevented in contrast to the greater extent of degradation that may be associated with a conventional process using an $H_2O$ reactive gas.

A purge gas may be supplied into the chamber (step F2'-9 of FIG. 2). An inert gas including, but not limited to, argon gas or nitrogen gas, may be employed as the purge gas. The purge gas may be supplied for a period of time in a range of about 0.5 to 20 seconds. By supplying the purge gas into the chamber as described above, chemically unreacted ozone reactive gas may be removed from the chamber. In some embodiments, the inside of the chamber is maintained in vacuum for a period of time in a range from about 2 to 15 seconds instead of supplying the purge gas into the chamber in order to remove chemically unreacted ozone reactive gas. In some embodiments, the purge gas may be supplied into the chamber while the inside of the chamber is continuously evacuated to obtain the same or similar effect.

Thereafter, a deposited thickness ZT1 of the zirconium oxide layer is measured (step F2'-10 of FIG. 2). Steps F2'-3 to F2'-11 of FIG. 2 may be repeated until the deposited thickness ZT1 of the zirconium oxide layer reaches the initially determined thickness ZT0.

Subsequently, a first aluminum oxide layer A1 is formed on the semiconductor substrate 10 having the first zirconium oxide layer Z1 in the same chamber (step F3' of FIG. 1). The method of forming the first aluminum oxide layer A1 will now be described in detail with reference to FIG. 3. The semiconductor substrate 10 having the first zirconium oxide layer Z1 is prepared in a chamber (step F3'-1 of FIG. 3). The inside of the chamber may be maintained at a temperature in a range of about 200 to 400° C. under a pressure in a range of about 0.1 to 3.0 Torr.

A thickness ATO of the aluminum oxide layer may be determined (step F3'-2 of FIG. 3). When the aluminum oxide layer is formed to a thickness of about 20 Å or more, the equivalent oxide thickness may become unsuitable. Therefore, the thickness ATO of the aluminum oxide layer may be less than about 20 Å. A TMA source gas is supplied into the chamber (step F3'-3 of FIG. 3). The TMA source gas may be injected into the chamber while a gas supply line disposed in a shower head mounted in the chamber is configured to maintain the gas at a temperature in a range of about 20 to 130° C. The TMA source gas may be supplied for a period of time in a range of about 0.5 to 3 seconds. As a result, an aluminum monatomic layer is chemisorbed on the semiconductor substrate 10 having the first zirconium oxide layer Z1 (step F3'-4 of FIG. 3).

A purge gas may be supplied into the chamber (step F3'-5 of FIG. 3). An inert gas, such as argon gas or nitrogen gas, may be employed as an exemplary purge gas. The purge gas may be supplied for a period of time in a range of about 0.5 to 20 seconds. By supplying the purge gas into the chamber as described above, portions of the TMA source gas, which are floating or physisorbed in the chamber, may be removed from the semiconductor substrate 10 having the first zirconium oxide layer Z1. In some embodiments, the inside of the chamber may be maintained in vacuum for a period of time in a range of about 2 to 10 seconds instead of supplying the purge gas into the chamber, so that the portions of the TMA source gas, which are floating or physisorbed in the chamber, may be removed. In some embodiments, the purge gas may be supplied into the chamber while the inside of the chamber is continuously evacuated to obtain the same or similar effect.

Subsequently, an ozone reactive gas may be supplied into the chamber (step F3'-6 of FIG. 3). The ozone reactive gas may be supplied for a period of time in a range of about 1 to 7 seconds. As a result, the ozone reactive gas reacts with the chemisorbed aluminum monatomic layer, thus generating the aluminum oxide layer (step F3'-8 of FIG. 3). In some embodiments, plasma power may be supplied to the chamber in which the ozone reactive gas is injected (step F3'-7 of FIG. 3). As a result, plasma may be generated in the chamber during the formation of the aluminum oxide layer, so the aluminum oxide layer may have suitable layer characteristics. By using the ozone reactive gas in forming the aluminum oxide layer, the degradation of a dielectric layer due to —OH radicals contained in the dielectric layer may be reduced or prevented unlike the extent of degradation associated with employing a conventional process using an $H_2O$ reactive gas.

A purge gas may be supplied into the chamber (step F3'-9 of FIG. 3). An inert gas, such as argon gas or nitrogen gas, may be employed as an exemplary purge gas. The purge gas may be supplied for a period of time in a range of about 0.5 to 20 seconds. By supplying the purge gas into the chamber as described above, a chemically unreacted ozone reactive gas may be removed from the chamber. Thereafter, a deposited thickness AT1 of the aluminum oxide layer may be measured (step F3'-10 of FIG. 3). Steps F3'-3 to F3'-11 of FIG. 3 may be repeated until the deposited thickness AT1 of the aluminum oxide layer reaches the initially determined thickness AT0.

Subsequently, a deposited thickness T1 of the inter-gate dielectric layer 30 may be measured (step F4' of FIG. 1). Steps F2' to F5' of FIG. 1 may be repeated until the deposited thickness T1 of the inter-gate dielectric layer 30 reaches an initially determined thickness T0. In some embodiments, steps F2' to F5' are repeated, and thus a second zirconium oxide layer Z2 and a second aluminum oxide layer A2 may be further formed. Afterwards, an upper SiO layer 32 may be formed on the semiconductor substrate 10 having the second aluminum oxide layer A2. Alternatively, an AlO layer may be formed instead of the upper SiO layer 32. The upper SiO layer 32 may be formed to a thickness of about 10 Å or less.

Consequently, the inter-gate dielectric layer 30 according to some embodiments of the present invention may include the lower SiO layer 27, the first zirconium oxide layer Z1, the first aluminum oxide layer A1, the second zirconium oxide layer Z2, the second aluminum oxide layer A2 and the upper SiO layer 32, which are sequentially stacked. The inter-gate dielectric layer 30 may be formed in an amorphous structure to minimize the leakage current during driving of the flash memory device.

In some embodiments, steps F2", F3", F4", and F5" of FIG. 1 may be carried out so that the inter-gate dielectric layer 30 may include a first aluminum oxide layer, a first zirconium oxide layer, a second aluminum oxide layer and a second zirconium oxide layer which are sequentially stacked.

As described above, the inter-gate dielectric layer 30 may be formed to a thickness of about 100 to 500 Å. The inter-gate dielectric layer 30 may be formed to a thickness larger than that of a gate insulating layer of a transistor or a dielectric layer of a capacitor because a voltage applied between both terminals of the inter-gate dielectric layer 30 is higher than a voltage applied to the gate insulating layer of the transistor or the dielectric layer of the capacitor. The thickness of each of the zirconium oxide layers Z1 and Z2 may be about 0.5 to 5 times as thick as each of the aluminum oxide layers A1 and A2.

A control gate layer CG may be formed on the inter-gate dielectric layer 30 (step F6 of FIG. 1). The control gate layer CG may be a polysilicon layer, a metal nitride layer and a tungsten layer which are sequentially stacked, or a metal nitride layer and a tungsten layer which are sequentially stacked. In some embodiments, the control gate layer CG may be formed by sequentially stacking a polysilicon layer 35, a metal nitride layer 37, and a tungsten layer 40. After the polysilicon layer 35 is formed, it may be planarized. Accordingly, the metal nitride layer 37 and the tungsten layer 40 may be formed on the planarized polysilicon layer 35. The metal nitride layer 37 may be formed of at least one nitride layer including a tungsten nitride layer, a titanium nitride layer, and a tantalum nitride layer. The metal nitride layer 37 may be formed using at least one process including an ALD process, an SFD process, a CVD process, and a PVD process.

Referring to FIGS. 1, 4, 7A, and 7B, the control gate layer CG, the inter-gate dielectric layer 30, and the floating gate patterns 25 may be patterned by photolithography and etching processes. As a result, floating gates 25', inter-gate dielectric layer patterns 30', and control gates CG' may be formed (step F7 of FIG. 1). The inter-gate dielectric layer patterns 30' and the control gates CG' may be sequentially stacked across the active regions A in the line shape. The floating gates 25' may be formed in an island configuration between the active regions A and the inter-gate dielectric layer patterns 30'. During step F7 of FIG. 1, the tunnel oxide layer 20 may be patterned so that tunnel oxide layer patterns 20' may be formed.

Each of the inter-gate dielectric layer patterns 30' may include a lower SiO pattern 27', a first zirconium oxide layer pattern Z1', a first aluminum oxide layer pattern A1', a second zirconium oxide layer pattern Z2', a second aluminum oxide layer pattern A2', and an upper SiO pattern 32' which are sequentially stacked. The first and second aluminum oxide layer patterns A1' and A2' may have a high crystallization temperature. Accordingly, the first and second zirconium oxide layer patterns Z1' and Z2' with a relatively low crystallization temperature and the first and second aluminum oxide layer patterns A1' and A2' with a higher crystallization temperature may be alternately formed to increase the crystallization temperature of the first and second zirconium oxide layer patterns Z1' and Z2'. As a result, the inter-gate dielectric layer patterns 30' of the flash memory device may have a generally amorphous structure, and thus leakage current may decrease. Each of the control gates CG' may include a polysilicon pattern 35', a metal nitride layer pattern 37', and a tungsten pattern 40' which are sequentially stacked.

The tunnel oxide layer patterns 20', the floating gates 25', the inter-gate dielectric layer patterns 30', and the control gates CG' constitute gate patterns. Gate spacers 45 may be formed on sidewalls of the gate patterns. Impurity ions may be implanted into the semiconductor substrate 10 using the gate patterns and the gate spacers 45 as masks, thereby forming source regions S and drain regions D.

Referring to FIGS. 1, 4, 8A, and 8B, an interlayer dielectric layer 50 is formed on the semiconductor substrate 10 having the gate patterns. Afterwards, bit line contact holes 55h may be formed through the interlayer dielectric layer 50 to expose the drain regions D. A conductive layer may be formed on the semiconductor substrate 10 having the bit line contact holes 55h to fill the bit line contact holes 55h and cover the interlayer dielectric layer 50. As a result, bit line contact plugs 55 may be filled in the bit line contact holes 55h. The conductive layer may be patterned, thereby forming bit lines 60 on the interlayer dielectric layer 50. The bit lines 60 contact the bit line contact plugs 55 and run across the control gates CG'.

Hereinafter, the structure of the flash memory device according to some embodiments of the present invention will be described with reference to FIGS. 4, 8A, and 8B.

An isolation layer 15 may be disposed in a semiconductor substrate 10 to define a plurality of active regions A. Gate patterns may be disposed on the semiconductor substrate 10 across the active regions A. The gate patterns may include tunnel oxide layer patterns 20', floating gates 25', inter-gate dielectric layer patterns 30', and control gates CG' which are sequentially stacked. The inter-gate dielectric layer patterns 30' and the control gates CG' may be sequentially stacked across the active regions A in a line shape. The floating gates 25' may be disposed in an island configuration between the active regions A and the inter-gate dielectric layer patterns 30'.

The floating gates 25' may be formed of a polysilicon layer. In some embodiments, the floating gates 25' may be formed of a polysilicon layer and a metal nitride layer which are sequentially stacked. Alternatively, the metal nitride layer may be at least one nitride layer including tungsten nitride (WN) layer, a titanium nitride (TiN) layer and a tantalum nitride (TaN) layer.

The inter-gate dielectric layer patterns 30' may have a structure in which a zirconium oxide layer and an aluminum oxide layer are alternately stacked at least twice. A zirconium oxide layer or aluminum oxide layer may be disposed as the lowermost layer of the inter-gate dielectric layer patterns 30'. Also, a zirconium oxide layer or aluminum oxide layer may be disposed as the uppermost layer of the inter-gate dielectric layer patterns 30'.

The inter-gate dielectric layer patterns 30' may have a thickness in a range of about 100 to 500 Å. The thickness of the single zirconium oxide layer may be about 0.5 to 5 times as thick as the single aluminum oxide layer. The single zirconium oxide layer may be about 30 Å or less in thickness, and the single aluminum oxide layer may be about 20 Å or less in thickness. A SiO layer or AlO layer may be disposed on the lowermost layer and/or uppermost layer of the inter-gate dielectric layer patterns 30'. The SiO layer or AlO layer may be about 10 Å or less in thickness.

Figure 8A:
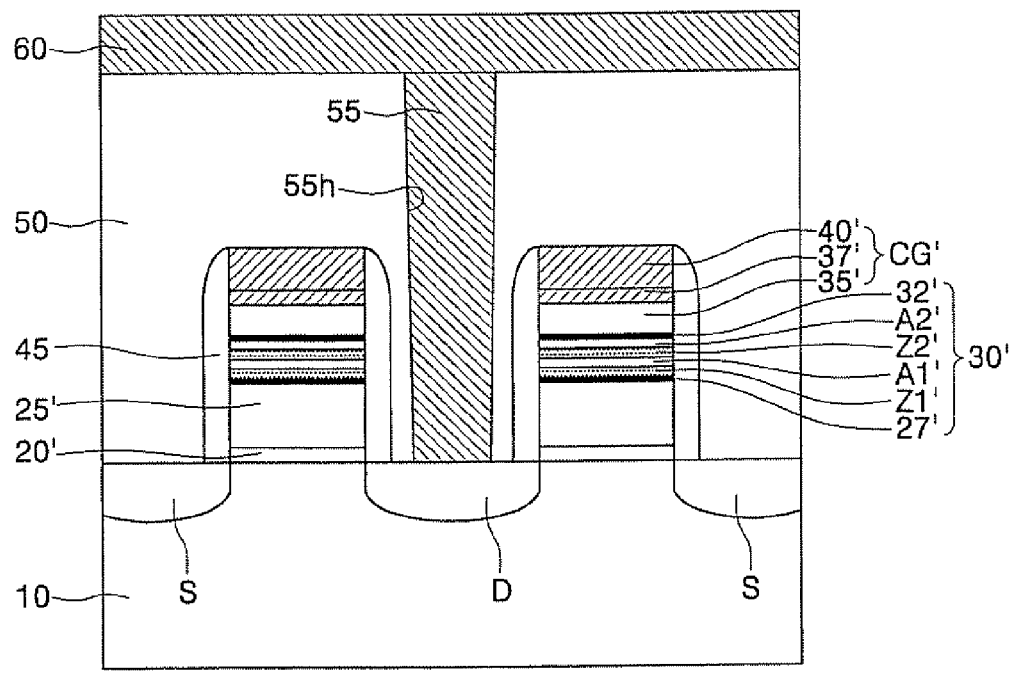
Figure 8B:
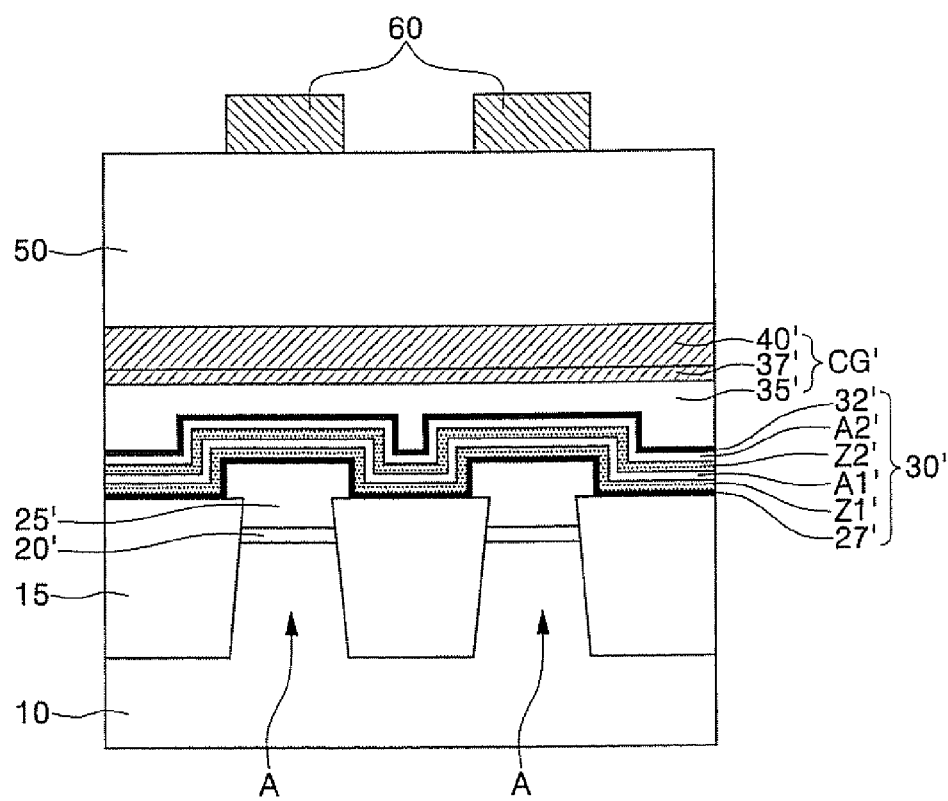

In some embodiments, each of the inter-gate dielectric layer patterns 30' may include a lower SiO pattern 27', a first zirconium oxide layer pattern Z1', a first aluminum oxide layer pattern A1', a second zirconium oxide layer pattern Z2', a second aluminum oxide layer pattern A2', and an upper SiO pattern 32' which are sequentially stacked, as can be seen from FIG. 8A. The inter-gate dielectric layer patterns 30' may have a generally amorphous structure. Accordingly, the leakage current of the flash memory device may decrease, at least in part, as a result thereof.

Each of the control gates CG' may include a polysilicon pattern 35', a metal nitride layer pattern 37', and a tungsten pattern 40' which are sequentially stacked. In some embodiments, each of the control gates CG' may include a metal nitride layer pattern and a tungsten pattern which are sequentially stacked. The metal nitride layer pattern may be formed of at least one layer including a tungsten nitride (WN) layer, a titanium nitride (TiN) layer, and a tantalum nitride (TaN) layer.

Gate spacers 45 may be disposed on sidewalls of the gate patterns. Source regions S and drain regions D may be disposed in the active regions A between the gate patterns. An interlayer dielectric layer 50 may be disposed on the semiconductor substrate 10 having the gate patterns. Bit line contact holes 55h may be disposed through the interlayer dielectric layer 50 to expose the drain regions D. Bit line contact plugs 55 are filled in the bit line contact holes 55h. Bit lines 60 are disposed on the interlayer dielectric layer 50 to contact the bit line contact plugs 55 and run across the control gates CG'.

As described above, embodiments of the present invention may provide methods of forming an inter-gate dielectric layer by alternately stacking a zirconium oxide layer and an aluminum oxide layer in order to minimize leakage current during the driving of a flash memory device. The inter-gate dielectric layer of the flash memory device may have a zirconium oxide layer with an amorphous structure, thus forming inter-gate dielectric layer patterns with a generally amorphous structure. As a result, the leakage current of the inter-gate dielectric layer may decrease. Further, since the inter-gate dielectric layer may be formed by an ALD process using an ozone reactive gas, the degradation of a dielectric layer may be reduced or prevented unlike the effects that may be associated with employing a conventional method using an $H_2O$ reactive gas.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A method of manufacturing a memory device, comprising:

forming floating gate patterns on a semiconductor substrate having active regions thereon, wherein the floating gate patterns cover the active regions and are spaced apart from the active regions;

forming an inter-gate dielectric layer on the semiconductor substrate having the floating gate patterns by alternately stacking a zirconium oxide layer and an aluminum oxide layer at least once using a process using $O_3$ gas as a reactive gas, wherein the zirconium oxide layer is formed using TEMAZ (tetrakis methylethylamino zirconium; $Zr[N(CH_3)(C_2H_5)]_4$) gas as a source gas;

forming a control gate layer on the inter-gate dielectric layer; and forming a control gate, an inter-gate dielectric layer pattern and a floating gate by sequentially patterning the control gate layer, the inter-gate dielectric layer and the floating gate pattern, wherein the inter-gate dielectric layer pattern and the control gate are sequentially stacked across the active regions, and the floating gate is formed between the active regions and the inter-gate dielectric layer pattern.

2. The method according to claim 1, wherein the zirconium oxide layer or the aluminum oxide layer is formed as the lowermost layer of the inter-gate dielectric layer.

3. The method according to claim 1, wherein forming the zirconium oxide layer comprises:

forming a zirconium monatomic layer on the semiconductor substrate by supplying the TEMAZ source gas into a chamber;

removing the remaining TEMAZ source gas from the chamber using a purge gas;

forming the zirconium oxide layer by supplying an $O_3$ reactive gas into the chamber to react the zirconium monatomic layer with the $O_3$ reactive gas; and removing the remaining $O_3$ reactive gas from the chamber by using a purge gas.

4. The method according to claim 3, wherein the TEMAZ source gas is supplied to the chamber in a gas supply line disposed in a shower head installed on the chamber wherein the gas supply line is configured to maintain the source gas in the gas supply line at a temperature in a range of about 80° C. to 130° C.

5. The method according to claim 3, wherein forming the zirconium oxide layer by reacting the zirconium monatomic layer with the $O_3$ reactive gas comprises generating plasma by applying plasma power to the chamber.

6. The method according to claim 1, wherein the aluminum oxide layer is formed using TMA(trimethyl aluminum; $Al(CH_3)_3$) gas as a source gas.

7. The method according to claim 6, wherein forming the aluminum oxide layer comprises:

forming an aluminum monatomic layer on the semiconductor substrate by supplying a TMA source gas into a chamber;

removing the remaining TMA source gas by supplying a purge gas into the chamber;

forming the aluminum oxide layer by supplying the $O_3$ reactive gas into the chamber to react the aluminum monatomic layer with the $O_3$ reactive gas; and removing the remaining $O_3$ reactive gas by supplying a purge gas into the chamber.

8. The method according to claim 7, wherein the TMA source gas is supplied to the chamber in a gas supply line disposed in a shower head installed on the chamber wherein the gas supply line is configured to maintain the source gas in the gas supply line at a temperature in a range of about 20° C. to 130° C.

9. The method according to claim 7, wherein forming the aluminum oxide layer by reacting the aluminum monatomic layer with the $O_3$ reactive gas comprises generating plasma by applying plasma power to the chamber.

10. The method according to claim 1, wherein the inter-gate dielectric layer is formed to a thickness in a range of about 100 to 500 Å.

11. The method according to claim 1, wherein a single layer of the zirconium oxide layer is about 0.5 to 5 times as thick as a single layer of the aluminum oxide layer.

12. The method according to claim 1, wherein a single layer of the zirconium oxide layer is formed to a thickness of about 30 Å or less.

13. The method according to claim 1, wherein a single layer of the aluminum oxide layer is formed to a thickness of about 20 Å or less.

14. The method according to claim 1, wherein the inter-gate dielectric layer is formed in an amorphous structure.

15. The method according to claim 1, wherein the inter-gate dielectric layer is formed using an atomic layer deposition process.

16. The method according to claim 1, further comprising forming a SiO layer or an AlO layer on the lowermost layer and/or the uppermost layer of the inter-gate dielectric layer.

17. The method according to claim 16, wherein the SiO layer or the AlO layer is formed to a thickness of about 10 Å or less.

18. A method of manufacturing a flash memory device, comprising:
preparing a semiconductor substrate having active regions thereon; and
forming a floating gate, an inter-gate dielectric layer pattern, and a control gate which are sequentially stacked across the active regions and spaced apart from the active regions on the semiconductor substrate,
wherein the inter-gate dielectric layer pattern is formed by alternately stacking a zirconium oxide layer and an aluminum oxide layer at least twice employing an atomic layer deposition (ALD) process using $O_3$ gas as a reactive gas, wherein the zirconium oxide layer is formed using TEMAZ gas as a source gas.

19. The method according to claim 18, wherein the zirconium oxide layer or the aluminum oxide layer is formed as the lowermost layer of the inter-gate dielectric layer pattern.

20. The method according to claim 18, wherein the aluminum oxide layer is formed using TMA gas as a source gas.

21. The method according to claim 18, wherein the inter-gate dielectric layer pattern is formed to a thickness of about 100 to 500 Å.

22. The method according to claim 18, wherein a single layer of the zirconium oxide layer is about 0.5 to 5 times as thick as a single layer of the aluminum oxide layer.

23. The method according to claim 18 wherein a single layer of the zirconium oxide layer is formed to a thickness of about 30 Å or less.

24. The method according to claim 18, wherein a single layer of the aluminum oxide layer is formed to a thickness of about 20 Å or less.

25. The method according to claim 18, wherein the inter-gate dielectric layer pattern is formed in an amorphous structure.

26. The method according to claim 18, wherein the zirconium oxide layer has a lower crystallization temperature compared to the crystallization temperature of the aluminum oxide layer.

27. A method of manufacturing a memory device, comprising:
forming floating gate patterns on a semiconductor substrate having active regions thereon, wherein the floating gate patterns cover the active regions and are spaced apart from the active regions;
forming an inter-gate dielectric layer on the semiconductor substrate having the floating gate patterns by alternately stacking metal oxide layers at least twice using a deposition process using $O_3$ gas as a reactive gas;
forming a control gate layer on the inter-gate dielectric layer; and
forming a control gate, an inter-gate dielectric layer pattern and a floating gate by sequentially patterning the control gate layer, the inter-gate dielectric layer and the floating gate pattern,
wherein (i) the metal oxide is formed using a source gas that is supplied to a chamber in a gas supply line disposed in a shower head installed on the chamber wherein the gas supply line is configured to maintain the source gas in the gas supply line at a temperature in a range of about 20° C. to 130° C., and (ii) the inter-gate dielectric layer pattern and the control gate are sequentially stacked across the active regions, and the floating gate is formed between the active regions and the inter-gate dielectric layer pattern.

28. A method of manufacturing a semiconductor device, comprising:
forming a first dielectric layer on a substrate, wherein the first dielectric layer is formed by alternately stacking a zirconium oxide layer and an aluminum oxide layer at least twice using an atomic layer deposition (ALD) process comprising $O_3$ gas as a reactive gas, wherein the zirconium oxide layer is formed using TEMAZ gas as a source gas;
forming a conductive layer on the first dielectric layer; and
forming a second dielectric layer on a lowermost and/or on an uppermost of the layers comprising first dielectric layer, wherein the energy band gap of the second dielectric layer is greater than the energy band gap of the first dielectric layer.

29. The method according to claim 28, wherein the second dielectric comprises a SiO layer.

* * * * *